United States Patent
Lin (10) Patent No.: US 10,257,919 B1
(45) Date of Patent: Apr. 9, 2019

(54) NETWORK SOCKET DEVICE WITH COMPENSATION MEANS

(71) Applicant: Jyh Eng Technology Co., Ltd., New Taipei (TW)

(72) Inventor: Yen-Lin Lin, New Taipei (TW)

(73) Assignee: JYH ENG TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/869,570

(22) Filed: Jan. 12, 2018

(51) Int. Cl.
| | |
|---|---|
| H01R 24/00 | (2011.01) |
| H01R 13/66 | (2006.01) |
| H05K 1/02 | (2006.01) |
| H01R 24/20 | (2011.01) |
| H01R 13/6461 | (2011.01) |
| H01R 24/64 | (2011.01) |

(52) U.S. Cl.
CPC ....... H05K 1/0216 (2013.01); H01R 13/6461 (2013.01); H01R 13/6691 (2013.01); H01R 24/20 (2013.01); H01R 24/64 (2013.01); H05K 2201/09236 (2013.01)

(58) Field of Classification Search
CPC .......... H01R 13/6272; H01R 13/6461; H01R 13/6691; H01R 24/20; H01R 24/64; H01R 13/665; Y10S 439/941
See application file for complete search history.

(56) References Cited

U.S. PATENT DOCUMENTS

| | | | |
|---|---|---|---|
| 6,764,348 B2 | 7/2004 | Han et al. | |
| 6,895,557 B1 | 5/2005 | Wood et al. | |
| 6,932,655 B2 | 8/2005 | Hatterscheid et al. | |
| 7,190,594 B2 | 3/2007 | Hashim et al. | |
| 7,264,516 B2 | 9/2007 | Hashim et al. | |
| 7,481,678 B2 | 1/2009 | Aekins | |
| 8,052,482 B1 * | 11/2011 | Lin | H01R 13/6467 439/676 |
| 8,202,129 B2 * | 6/2012 | Lin | H01R 13/15 439/676 |
| 8,257,118 B2 | 9/2012 | Bareel et al. | |
| 8,936,494 B2 * | 1/2015 | Weinmann | H01R 13/6466 439/620.17 |
| 9,118,134 B2 * | 8/2015 | Babu | H01R 13/26 |
| 9,531,135 B2 * | 12/2016 | Gatnau Navarro | H01R 13/665 |

* cited by examiner

*Primary Examiner* — Xuong M Chung Trans
(74) *Attorney, Agent, or Firm* — Guice Patents PLLC (57) ABSTRACT

A network socket device includes a communication module composed of a main circuit board with via holes, a gold pin set and a compensation circuit board. The gold pin set is connected to the main circuit board, including a pin holder block, first gold pins inserted through the pin holder block and connected to respective via holes of the main circuit board and second gold pins inserted through the pin holder block and connected to respective via holes of the main circuit board. Each second gold pin has a connection portion backwardly extended from one end thereof opposite to the main circuit board. The gold pin set is electrically connected to the compensation circuit board to provide a compensation signal for reducing crosstalk between gold pins.

9 Claims, 9 Drawing Sheets

NETWORK SOCKET DEVICE WITH COMPENSATION MEANS

BACKGROUND OF THE INVENTION

1. Field of the Invention

The present invention relates to network connector technology and more particularly, to network socket device with compensation means.

2. Description of the Related Art

At present, the common design of network line consists of four pairs of twisted copper cores, and these cores are distinguished and arranged in different colors. Currently in the network specification for the arrangement of the core line is to follow T568A or T568B line alignment. However, the common practice is that the line alignment is not arranged in sequence, especially the combination sequence of green twisted pairs and blue twisted pairs, which results in an occurrence of crosstalk.

In the current network socket module designs, in order to match the order of T568B line 1-8, the multiple gold pins in the module are also arranged in the order from 1 to 8, thus, crosstalk also occurs inside the module. In order to eliminate crosstalk, many techniques have been disclosed. For example, U.S. Pat. No. 6,764,348, U.S. Pat. No. 6,895,557, U.S. Pat. No. 6,932,655 teach different gold pin rear end shape designs for gold pin signal compensation or capacitive coupling enhancement measures. U.S. Pat. No. 7,190,594, U.S. Pat. No. 7,264,516 and U.S. Pat. No. 8,257,118 teach the arrangement of a compensation circuit on the circuit board or the use of a compensation circuit board to eliminate crosstalk.

Further, U.S. Pat. No. 7,481,678 discloses a modular insert and associated jack assembly used in telecommunication connector systems that reduces the adjacent lines electromagnetic interference from an adjacent transmitter for different plug assemblies. The internal contacts/lead frames feature a bi-sectional design. Internal EMI line reduction is allowed only when the bi-sectional contacts are electrically mated by a plug with corresponding contact layout. By isolating the contact sections in the interface system, the coupled signal for EMI balance is optionally utilized in a low cost and manufactuable design.

The techniques disclosed in U.S. Pat. No. 8,257,118 and U.S. Pat. No. 7,481,678 not only improve the crosstalk problem but also improve the problem of unstable contact caused by compensating the gold pin structure so that positive electric contact can be ensured for signal transmission when the gold pins are pressed down. However, in order to comply with the requirements of IEC60603-7 for constant temperature and humility and acid erosion resistance, the main gold pins and compensating gold pins must comply with the specifications, and the aforementioned structural design will inevitably result in an increase in cost.

SUMMARY OF THE INVENTION

The present invention has been accomplished under the circumstances in view. It is the main object of the present invention to provide a network socket device with compensation means, which eliminates the problem of high cost of the prior art two-set gold pin design and, which uses two set of golf pins in one single design to enhance the structural strength and to save the gold pin modular creation costs, enabling the end of each gold pin to be electrically connected to a compensation circuit board to create a compensation mechanism without the need of an extra space for the compensation structure.

To achieve this and other objects of the present invention, a network socket device comprises a communication module. The communication module comprises a main circuit board, a gold pin set and a compensation circuit board. The main circuit board is adapted for signal transmission, comprising a plurality of via holes. The gold pin set is electrically connected to the main circuit board, comprising an electrically insulative pin holder block, a plurality of first gold pins and a plurality of second gold pins. The first gold pins and the second gold pins are mounted in the holder block. Each first gold pin comprises a first conducting portion located on one end thereof and extended out of the pin holder block and electrically connected to one respective via hole of the main circuit board. Each second gold pin comprises a second conducting portion extended from one end thereof out of the pin holder block and electrically connected to one respective via hole of the main circuit board, and a connection portion extended from an opposite end thereof and curved backward. The compensation circuit board is electrically connected with the gold pin set for providing a compensation signal to eliminate crosstalk, comprising a plurality of contact holes respectively connected with the connection portions of the second gold pins for transmitting the compensation signal to the second gold pins.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
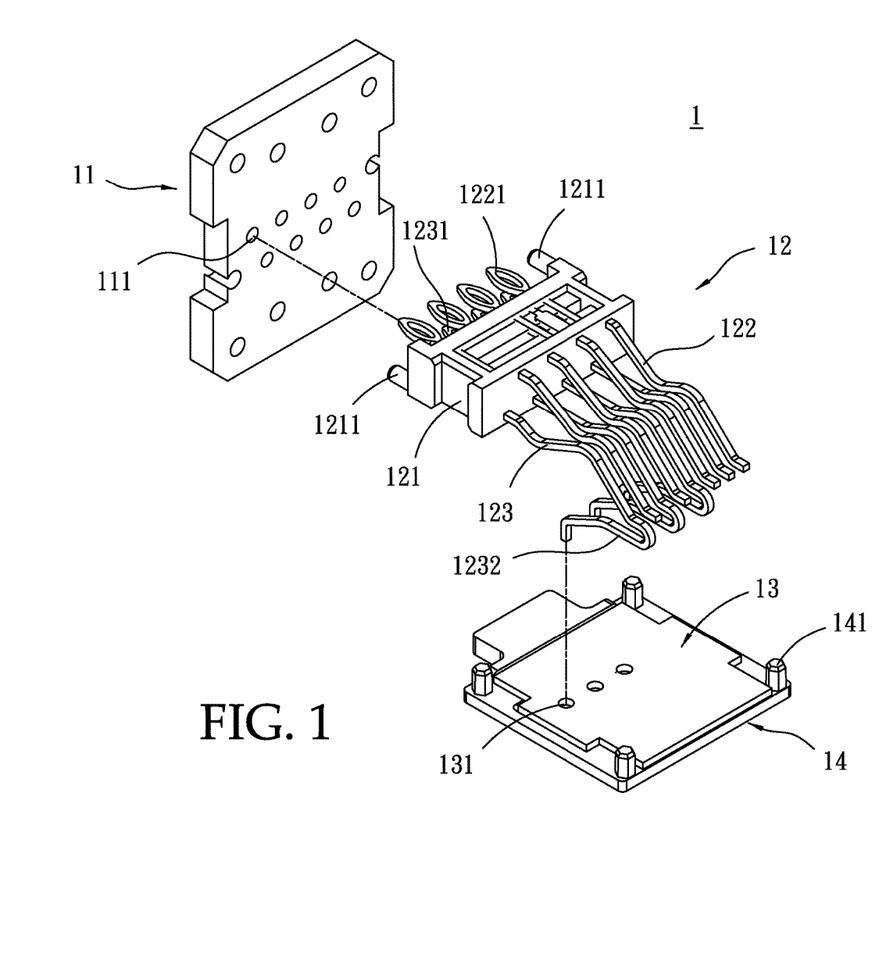
FIG. 1 is an exploded view of a communication module of a network socket device in accordance with the present invention.
Figure 2:
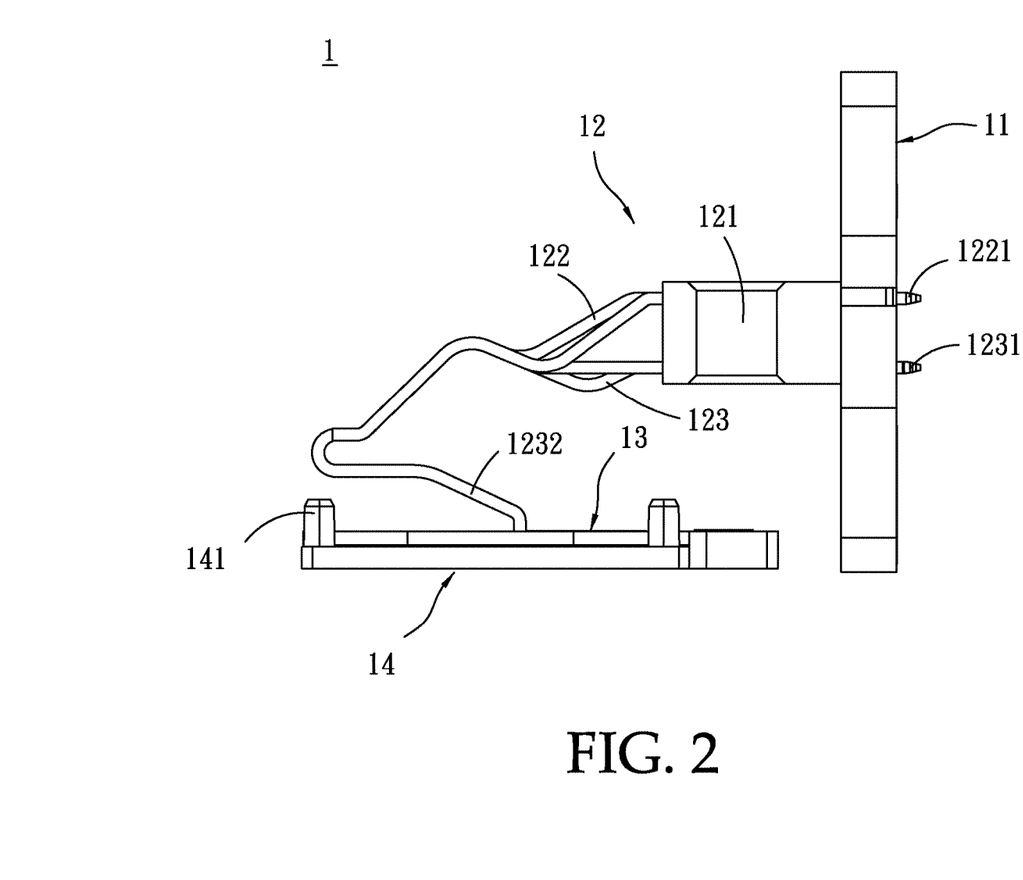
FIG. 2 is a sectional side view of the communication module.
Figure 3:
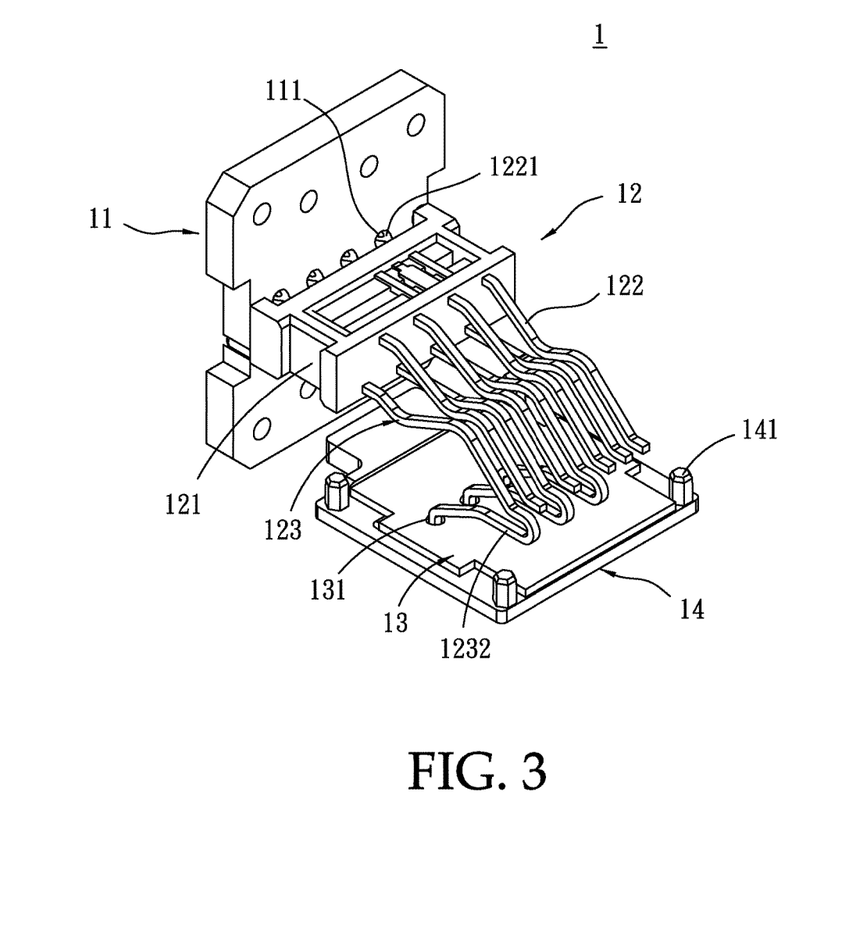
FIG. 3 is an oblique top elevational view of the communication module.

Referring to FIG. 1, a network socket device in accordance with the present invention is shown. The network socket device comprises a communication module 1. The communication module 1 mainly comprises a main circuit board 11, a gold pin set 12 and a compensation circuit board 13. The main circuit board 11 is electrically connected with the gold pin set 12 for signal transmission. The main circuit board 11 comprises a plurality of via holes 111. The gold pin set 12 comprises a pin holder block 121, a plurality of first gold pins 122 and a plurality of second gold pin 123. The pin holder block 121 is an electrically insulative block member, comprising a plurality of mounting rods 1211 located at a top side thereof for fastening to the main circuit board 11 to secure the pin holder block 121 to the main circuit board 11. The first gold pins 122 and second gold pins 123 are mounted in the pin holder block 121. The first gold pins 122 each comprise a first conducting portion 1221 located at one end thereof and respectively inserted through the pin holder block 121 and fastened to one respective via hole 111 of the main circuit board 11 to achieve electrical conduction between the first gold pin 122 and the main circuit board 11. The second golds pin 123 each comprise a second conducting portion 1231 located at one end thereof and respectively inserted through the pin holder block 121. In this embodiment, the second conducting portions 1231 exhibit a rhombic shape and are respectively inserted into one respective via hole 111 of the main circuit board 11 to achieve electrical conduction between the second gold pins 123 and the main circuit board 11. The second gold pins 123 and the first gold pin 122 are alternatively arranged in a staggered manner. Each second gold pin 123 has an opposite end thereof terminating in a curved connection portion 1232. The connection portion 1232 is integrally extended from the body of the second gold pin 123 and curved in the reversed direction relative to the body of the second gold pin 123, as illustrated in FIG. 2. Subject to this reversely curved design, positive contact and stable signal transmission can be achieved when the second gold pin 123 with the respective connection portion 1232 is forced down by an external pressure. The compensation circuit board 13 is electrically connected with the gold pin set 12 and adapted for providing a compensation signal to reduce crosstalk between gold pins, comprising a plurality of contact holes 131 for the connection of the connection portions 1232 of the respective second gold pins 123 to achieve electrical conduction between the compensation circuit board 13 and the gold pin set 12 so that the compensation circuit board 13 can transmit a compensation signal to the second gold pins 123. Further, the compensation circuit board 13 is mounted to a locating plate 14. The locating plate 14 has a positioning post 141 disposed in each corner thereof and adapted to hold the compensation circuit board 13 in position, as illustrated in FIG. 3.

Figure 4:
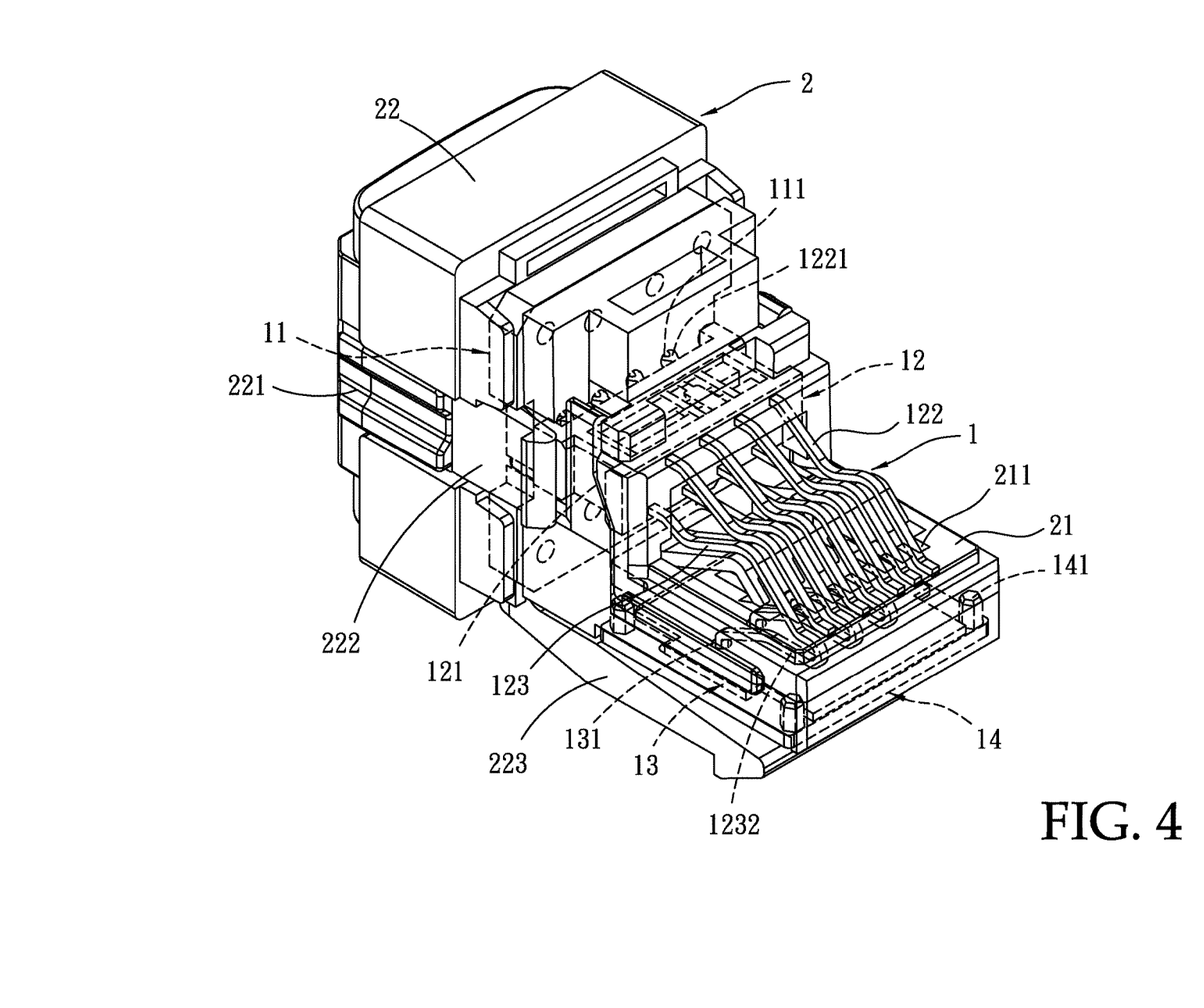
FIG. 4 is an elevational assembly view of the communication module and connection module of the network socket device in accordance with the present invention.

Referring to FIG. 4, the communication module 1 is installed in a connection module 2, enabling the main circuit board 11 and the compensation circuit board 13 to be accommodated inside the connection module 2. The connection module 2 comprises a positioning block 21. The positioning block 21 surrounds the compensation circuit board 13. The compensation circuit board 13 is affixed to the compensation circuit board 13 by means of the positioning posts 141. Further, the positioning block comprises a plurality of positioning through holes 211 respectively mounted onto the first gold pins 122 and the second gold pins 123, enabling the first gold pins 122 and the second gold pins 123 to expose to the outside of the connection module 2 for signal conduction. The connection module 2 further comprises an adapter block 22 connected to the positioning block 21 for outward transmission of signals from the communication module 1. The adapter block 22 comprises a guide rail 221 disposed at each of two opposite lateral sides thereof, a hook block 222 extended from one end of each guide rail 221 in a parallel manner, and a pressure plate 223 extended from a bottom side thereof to a bottom side of the positioning block 21, as illustrated in FIG. 5.

Figure 5:
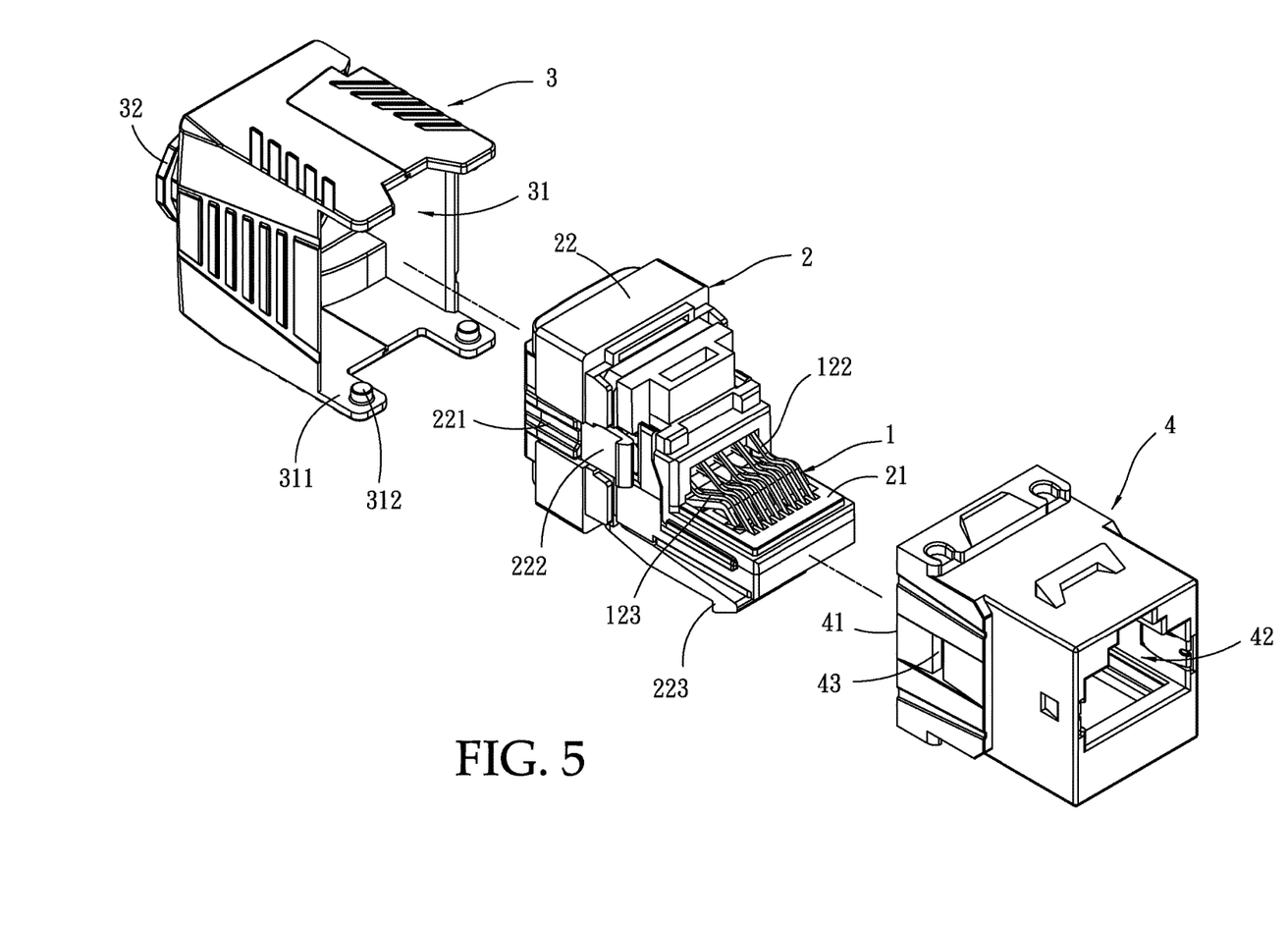
FIG. 5 is an exploded view of the network socket device in accordance with the present invention.
Figure 6:
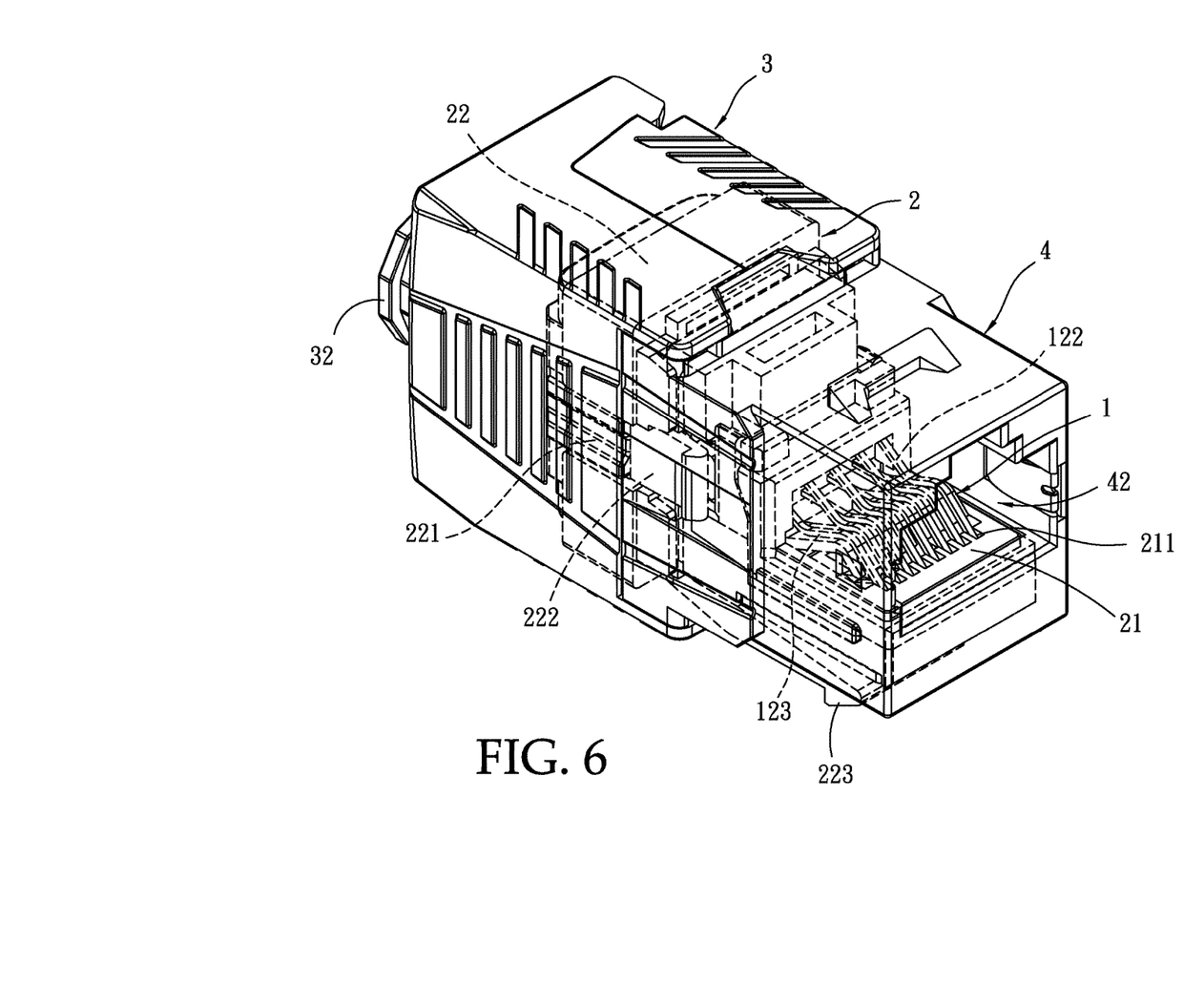
FIG. 6 is an assembly view of the network socket device in accordance with the present invention.

Referring to FIG. 5, the adapter block 22 of the connection module 2 is mounted in a guide block 3. The guide block 3 is a hollow member, comprising an open end 31 for the insertion and accommodation of the adapter block 22, a wire guide hole 32 disposed in communication with the open end 31, two extension plates 311 bilaterally extended from a bottom side of the open end 31, and a positioning protrusion 312 located on each extension plate 311. The guide block 3 is moved along the guide rails 221 of the adapter block 22 and then connected with the adapter block 22, forcing the positioning protrusions 312 into engagement with a bottom side of the connection module 2, and thus, the connection module 2 and the guide block 3 are firmly secured together. The wire guide hole 32 is adapted for mounting lead wires (not shown) for electrical conduction with the communication module 1. Further, the connection module 2 is also mounted in a receptacle block 4. The receptacle block 4 is a hollow block, comprising a mating connection hole 41 and a plug hole 42. The mating connection hole 41 is adapted for receiving the positioning block 21 of the connection module 2 to hold the positioning block 21 inside the receptacle block 4 and to keep the gold pin set 12 in alignment with the plug hole 42. The receptacle block 4 further comprises a hook hole 43 located on each of two opposite lateral sides thereof. After connection between the receptacle block 4 and the positioning block 21 of the connection module 2, the hook blocks 222 of the connection module 2 are respectively hooked in the respective hook holes 43 to secure the receptacle block 4 and the connection module 2 firmly together and to keep the pressure plate 223 of the connection module 2 in engagement with the bottom side of the receptacle block 4. Further, the plug hole 42 is configured for the insertion of a network connector, for example, RJ45 connector. FIG. 6 illustrates the connection module 2 the guide block 3 and the receptacle block 4 assembled.

Figure 7:
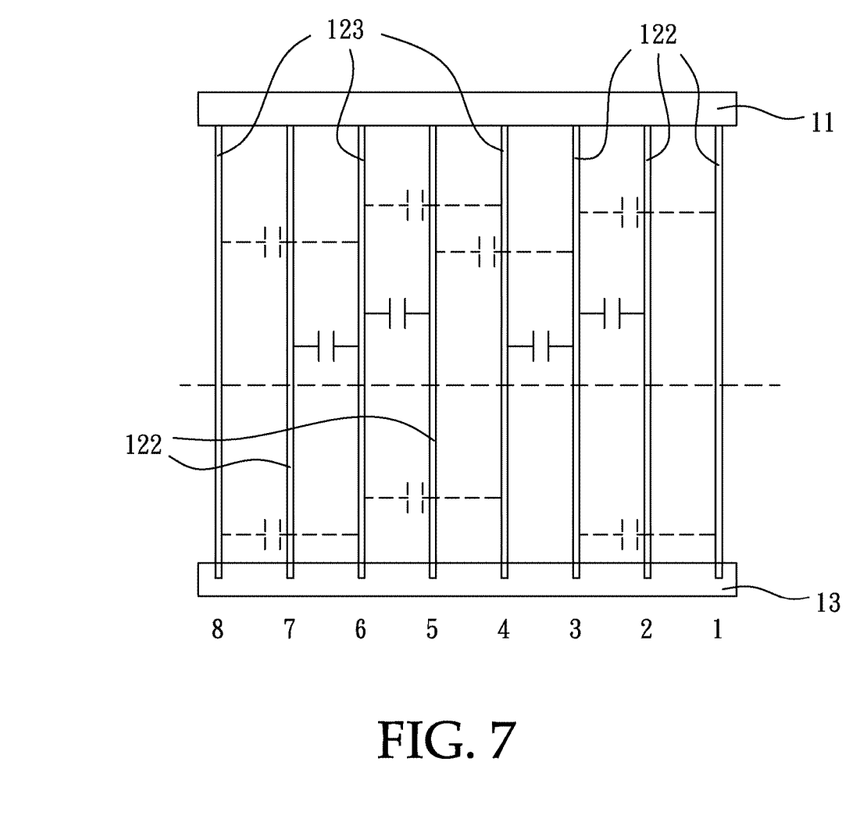
FIG. 7 is a compensation theory diagram of the present invention.

FIG. 7 is a compensation theory diagram of the present invention. The first gold pins 122 and the second gold pin 123 connected to the main circuit board 11 will have a natural crosstalk problem in the natural state. Especially, crosstalk occurs between the second and third pins, the third and fourth pins, the fifth and sixth pins, the sixth and seventh pins.

The contact point between the plug and the gold pin set 12 is a distinguish point (as shown by the dashed line in the figure). The crosstalk caused by the first gold pin 122 and the second gold pin 123 between the distinguish point and the main circuit board 11 will be compensated or even offset by pre-compensation. The crosstalk caused by the first gold pin 122 and the second gold pin 123 between the distinguish point and the connection portion 1232 can be compensated by the compensation circuit board 13 that is connected to the connection portion 1232. Thus, this two-step compensation measure significantly enhances the electrical characteristics.

Figure 8:
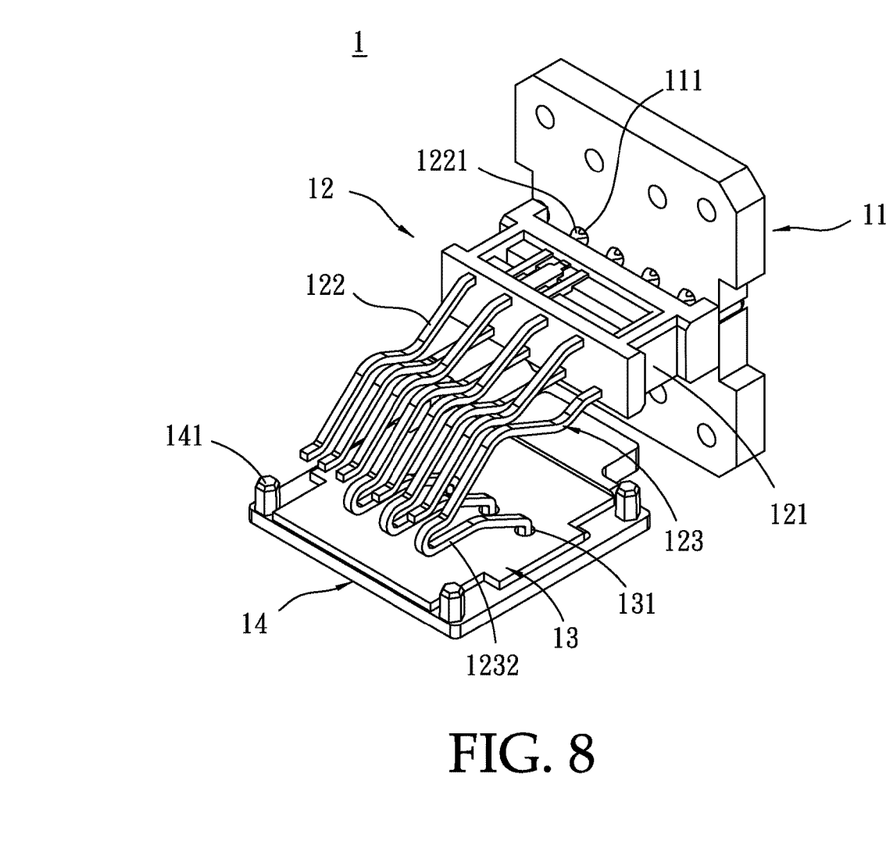
FIG. 8 illustrates an alternate form of the present invention.
Figure 9:
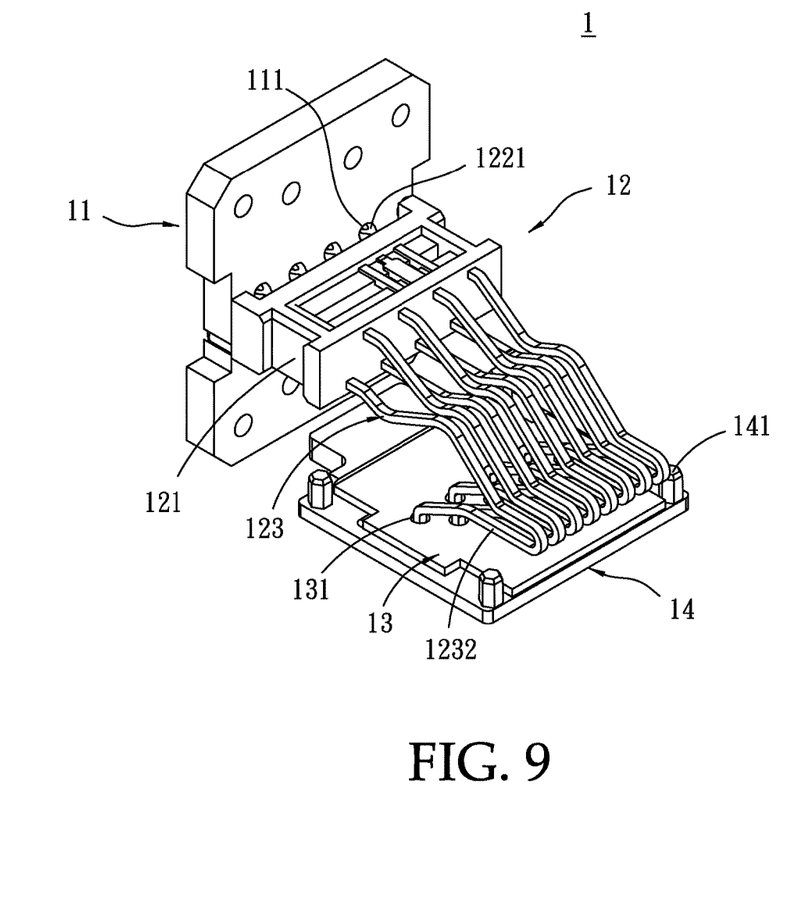
FIG. 9 illustrates another alternate form of the present invention.

FIG. 8 illustrates an alternate form of the present invention. An alternate arrangement of the first gold pins 122 and the second gold pins 123 is shown. In this alternate form, the first, third and fifth pins are the aforesaid second gold pins 123 each having a connection portion 1232. In another alternate form shown in FIG. 9, all the pins are the aforesaid second gold pins 123 each having a connection portion 1232.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A network socket device, comprising:
a communication module comprising a main circuit board, a gold pin set and a compensation circuit board, said main circuit board being adapted for signal transmission and comprising a plurality of via holes, said gold pin set being electrically connected to said main circuit board and comprising an electrically insulative pin holder block, a plurality of first gold pins mounted in said pin holder block and a plurality of second gold pins mounted in said pin holder block, each said first gold pin comprising a first conducting portion located on one end thereof and extended out of a rear of said pin holder block and electrically connected to one respective said via hole of said main circuit board, each said second gold pin comprising a second conducting portion extended from one end thereof out of said rear of said pin holder block and electrically connected to one respective said via hole of said main circuit board and a connection portion extended from an opposite end thereof and curved backward, said rear of said pin holder block being connected to a front of said main circuit board, said compensation circuit board being electrically connected with said gold pin set for providing a compensation signal to eliminate crosstalk, said compensation circuit board comprising a plurality of contact holes, said connection portions of said second gold pins are respectively inserted into a corresponding contact hole of said plurality of contact holes for transmitting said compensation signal to said second gold pins.

2. The network socket device as claimed in claim 1, wherein said pin holder block comprises a plurality of mounting rods located on a top side thereof for securing said main circuit board.

3. The network socket device as claimed in claim 1, wherein each said first conducting portion and each said second conducting portion exhibit a rhombic shape.

4. The network socket device as claimed in claim 1, wherein said second gold pins and said first gold pins are alternatively arranged in a staggered manner.

5. The network socket device as claimed in claim 1, further comprising a locating plate adapted to hold said compensation circuit board in place, said locating plate comprising a positioning post disposed in each corner thereof for securing said compensation circuit board.

6. The network socket device as claimed in claim 1, further comprising a connection module for accommodating said communication module, said connection module comprising a positioning block surrounding said compensation circuit board and an adapter block connected to said positioning block for guiding out signals from said communication module, said positioning block comprising a plurality of positioning through holes respectively aimed at said first gold pins and said second gold pins for enabling said first gold pins and said second gold pins to extend out of said connection module for signal conduction, said adapter block comprising two guide rails symmetrically located on two opposite lateral sides thereof, two hook blocks respectively disposed in parallel relative to said guide rails and a pressure plate extended from a bottom side thereof to a bottom side of said positioning block.

7. The network socket device as claimed in claim 6, further comprising:
a guide block connected to said adapter block of said connection module, said guide block comprising an open end located on one end thereof and adapted for extension plates bilaterally extended from a bottom side of said open end and a positioning protrusion located on each said extension plate and adapted for securing a bottom side of said connection module upon coupling of said guide block to said guide rails of said adapter block; and
a receptacle block adapted for receiving said connection module, said receptacle block comprising a mating connection hole, a plug hole and two hook holes, said mating connection hole being coupled with said positioning block of said connection module to hold said positioning block inside said receptacle block and to keep said gold pin set in alignment with said plug hole, said hook holes being located on two opposite lateral sides of said receptacle block and respectively forced into engagement with said hook blocks of said connection module to hold said pressure plate of said connection module in engagement with a bottom side of said receptacle block upon connection between said receptacle block and said positioning block of said connection module.

8. The network socket device as claimed in claim 7, wherein said guide block is a hollow member.

9. The network socket device as claimed in claim 7, wherein said receptacle block is a hollow member.

* * * * *